United States Patent
Kim

(10) Patent No.: US 7,928,524 B2
(45) Date of Patent: Apr. 19, 2011

(54) MAGNETORESISTIVE ELEMENT

(75) Inventor: Kee-won Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 193 days.

(21) Appl. No.: 12/385,119

(22) Filed: Mar. 31, 2009

(65) Prior Publication Data

US 2009/0278218 A1 Nov. 12, 2009

(30) Foreign Application Priority Data

May 7, 2008 (KR) .......................... 10-2008-0042459

(51) Int. Cl.
*H01L 29/82* (2006.01)
*H01L 43/00* (2006.01)

(52) U.S. Cl. ................ 257/421; 257/425; 257/E29.323; 257/E43.001

(58) Field of Classification Search .................. 257/421, 257/425, E29.323, E43.001
See application file for complete search history.

(56) References Cited

U.S. PATENT DOCUMENTS

| | | | | |
|---|---|---|---|---|
| 6,661,625 B1* | 12/2003 | Sin et al. | ..................... | 360/324.2 |
| 6,700,755 B2* | 3/2004 | Pinarbasi | ................. | 360/324.11 |
| 6,778,449 B2 | 8/2004 | Breitwisch et al. | ........... | 365/201 |
| 6,809,909 B2* | 10/2004 | Hou et al. | ................ | 360/324.11 |
| 6,934,131 B2* | 8/2005 | Mao et al. | ................ | 360/324.11 |
| 7,057,921 B2* | 6/2006 | Valet | ............... | 365/158 |
| 7,190,560 B2* | 3/2007 | Gill | .......... | 360/324.11 |
| 7,467,458 B2* | 12/2008 | Lin | ......... | 29/603.01 |
| 7,532,442 B2* | 5/2009 | Gill | .......... | 360/324.11 |
| 7,715,155 B2* | 5/2010 | Kagami et al. | ........... | 360/324.12 |
| 7,768,747 B2* | 8/2010 | Kagami et al. | ................ | 360/319 |
| 2004/0145836 A1* | 7/2004 | Kojima et al. | ........... | 360/324.12 |
| 2007/0297102 A1* | 12/2007 | Gill | .......... | 360/324.11 |
| 2009/0121710 A1* | 5/2009 | Wang et al. | .................... | 324/252 |

FOREIGN PATENT DOCUMENTS

JP 2006-302330 11/2006
KR 10-2003-0002247 1/2003

* cited by examiner

*Primary Examiner* — Ida M Soward
(74) *Attorney, Agent, or Firm* — Harness, Dickey & Pierce, P.L.C.

(57) ABSTRACT

A magnetoresistive element is disclosed, wherein the magnetoresistive element is composed of a synthetic anti-ferromagnetic (SAF) structure that may include a first pinned layer, an intermediate layer, and a second pinned layer; and a Cr layer between the first pinned layer and the intermediate layer and/or the second pinned layer and the intermediate layer.

20 Claims, 9 Drawing Sheets

MAGNETORESISTIVE ELEMENT

PRIORITY STATEMENT

This application claims priority under 35 U.S.C. §119 to Korean Patent Application No. 10-2008-0042459, filed on May 7, 2008, in the Korean Intellectual Property Office (KIPO), the entire contents of which are incorporated herein by reference.

BACKGROUND

1. Field

Example embodiments relate to a magnetoresistive element, and more particularly, to a magnetoresistive element including a synthetic anti-ferromagnetic (SAF) structure.

2. Description of the Related Art

Due to developments in the information industry and requirements for processing mass information, there is an increasing demand for high capacity data storage media. Accordingly, research on compact data storage media with relatively fast data storage speeds has been conducted, and as a result, various kinds of data storage devices have been developed.

Data storage devices may be broadly classified into volatile data storage devices and non-volatile data storage devices. Volatile data storage devices have relatively fast writing and reading speeds, but information recorded on such devices is erased when the power is turned off. A representative example of a volatile data storage device is a dynamic random access memory (DRAM). On the other hand, information recorded on a non-volatile data storage device is not erased when power is turned off. Representative examples of non-volatile data storage devices include hard disk drives (HDD) and non-volatile random access memories (RAM).

A magnetoresistive random access memory (MRAM) is a type of non-volatile memory that uses a magnetoresistive effect based on spin transfer. A typical MRAM is formed of a magnetoresistive element and a switch, for example, a transistor. In general, the magnetoresistive element may include a giant magnetoresistive (GMR) structure and a magnetic tunnel junction structure. The magnetic tunnel junction is formed of a pinned layer, a tunneling barrier, and a free layer, which are sequentially stacked on an anti-ferromagnetic layer. Recent research into magnetic tunnel junctions has produced a tunnel junction that may include a synthetic anti-ferromagnetic (SAF) structure that reduces stray fields by forming a multi-layered pinned layer or a free layer.

FIG. 1 is a cross-sectional view of a magnetoresistive element including an SAF structure according to the conventional art. Referring to FIG. 1, an anti-ferromagnetic layer 12 is formed on a bottom layer 11, and a pinned layer having an SAF structure is formed on the anti-ferromagnetic layer 12. The pinned layer includes a first pinned layer 13, an intermediate layer 14 (e.g., an anti-ferromagnetic coupling spacer layer), and a second pinned layer 15 formed on the intermediate layer 14. A tunneling barrier 16, a free layer 17, and a top layer 18 are sequentially formed on the second pinned layer 15. The anti-ferromagnetic layer 12 is formed of an anti-ferromagnetic material including Mn, for example, PtMn. The first pinned layer 13, the second pinned layer 15, and the free layer 17 are formed of ferromagnetic materials. The intermediate layer 14 is formed of Ru, and the tunneling barrier 16 is formed of one selected from the group consisting of Mg oxide, Al oxide, Hf oxide and Ta oxide.

The magnetoresistive element, including the SAF structure as illustrated in FIG. 1, requires thermal treatment to crystallize materials that form the layers, for example, the Mg oxide forming the tunneling barrier 16. During the thermal treatment, material forming the intermediate layer 14 may diffuse into the first pinned layer 13 or the second pinned layer 15, such that material properties may deteriorate and/or thermal stability may be reduced.

SUMMARY

Example embodiments may include a magnetoresistive element including a synthetic anti-ferromagnetic (SAF) structure having thermal stability.

According to example embodiments, a magnetoresistive element may include an anti-ferromagnetic layer; a pinned layer on the anti-ferromagnetic layer, and having an SAF structure including a first pinned layer, an intermediate layer, and a second pinned layer; and a Cr layer between the intermediate layer and one of the first pinned layer and the second pinned layer. According to example embodiments, a magnetoresistive element may include a first Cr layer between the intermediate layer and the first pinned layer and a second Cr layer between the intermediate layer and the second pinned layer.

According to example embodiments, the first pinned layer and/or the second pinned layer may include one selected from the group consisting of CoFe, CoFeB, and NiFe. The intermediate layer may include Ru. The anti-ferromagnetic layer may include one selected from the group consisting of PtMn, IrMn, NiMn and FeMn. The first Cr layer and or the second Cr layer may be formed wherein the Cr has a body centered cubic (BCC) structure. The thickness of the first Cr layer may be between about 1 Å and about 4 Å. The thickness of the second Cr layer may be between about 1 Å and about 4 Å. The thickness of the first Cr layer and the second Cr layer combined may be between about 7 Å and about 11 Å.

According to example embodiments, a magnetoresistive element may further include a tunneling barrier on the second pinned layer, a free layer on the tunneling barrier, a bottom layer on the anti-ferromagnetic layer and a top layer on the free layer. The tunneling barrier may include one selected from the group consisting of Mg Oxide, Al Oxide, Hf Oxide and Ta Oxide. The free layer may include one selected from the group consisting of CoFe, CoFeB, and NiFe. The bottom layer may include a transition metal nitride. The top layer may include a transition metal.

According to example embodiments, a magnetoresistive element may include a switch connected to the anti-ferromagnetic layer and including a source and a drain. The anti-ferromagnetic layer may be connected to either the source or the drain.

BRIEF DESCRIPTION OF THE DRAWINGS

Example embodiments will be more clearly understood from the following brief description taken in conjunction with the accompanying drawings. FIGS. 1-9 represent non-limiting, example embodiments as described herein.

FIG. 1 is a cross-sectional view of a magnetoresistive element according to the conventional art;

FIG. 2 is a cross-sectional view of a magnetoresistive element according to example embodiments;

FIG. 5 is a VSM graph of normalized magnetic moments versus magnetic field for magnetoresistive element samples, wherein the samples are manufactured according to a specific manufacturing process including a thermal treatment process performed at about 250° C. for about 2 hours;

FIG. 8 is a VSM graph of normalized magnetic moments versus magnetic field, wherein the samples are manufactured by forming an about 2 Å thick Cr layer on a first pinned layer and then varying the thickness of a Ru layer, which is an intermediate layer, from about 5 Å to about 9 Å; and FIG. 9 is a graph demonstrating saturation field (Hsat) measurement results for samples manufactured by varying the thickness of a Ru layer that is an intermediate layer.

Figure 1:
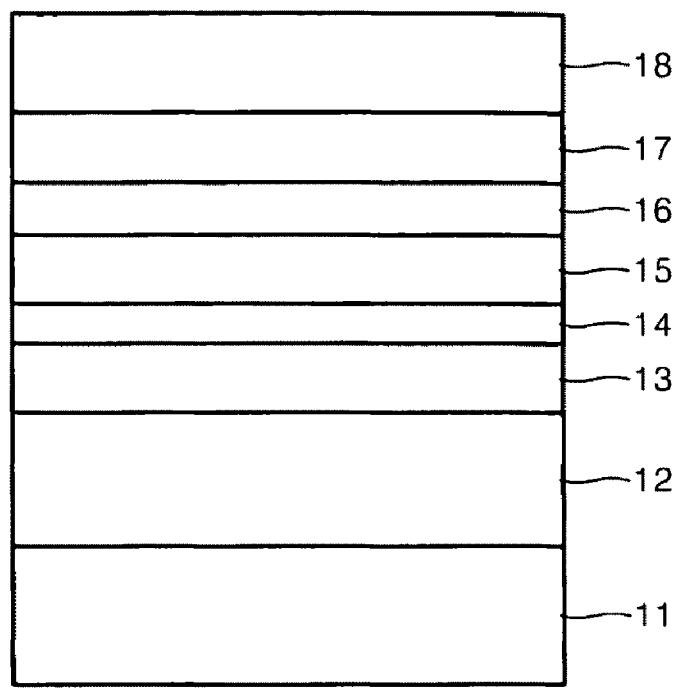

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A magnetoresistive element according to example embodiments may include a pinned layer having a synthetic anti-ferromagnetic (SAF) structure in which a Cr layer may be formed on or below an intermediate layer that is an anti-ferromagnetic coupling spacer layer.

Figure 2:
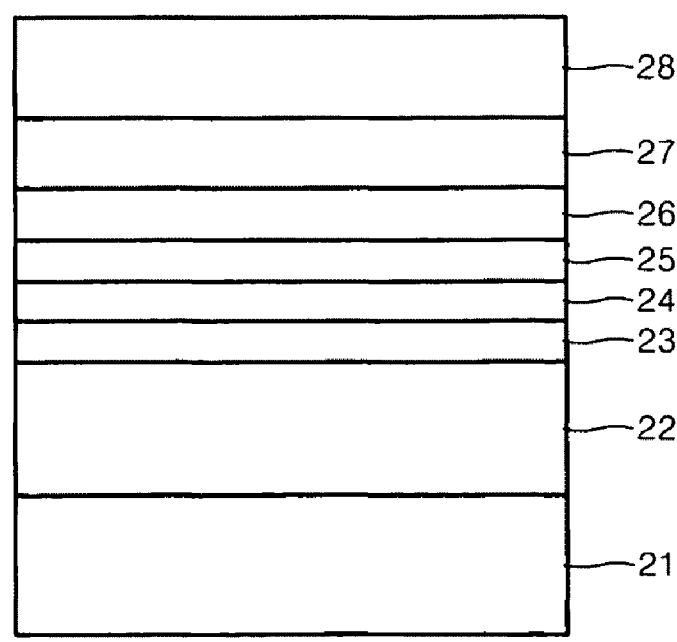

FIG. 2 is a cross-sectional view of a magnetoresistive element according to example embodiments. Referring to FIG. 2, the magnetoresistive element may include a pinned layer having an SAF structure formed on an anti-ferromagnetic layer 21. The pinned layer may include a first pinned layer 22, an intermediate layer 24, and a second pinned layer 26. Cr layers 23 and 25 may be respectively formed below and on the intermediate layer 24. A tunneling barrier 27 and a free layer 28 may be formed on the second pinned layer 26.

Figure 3A:
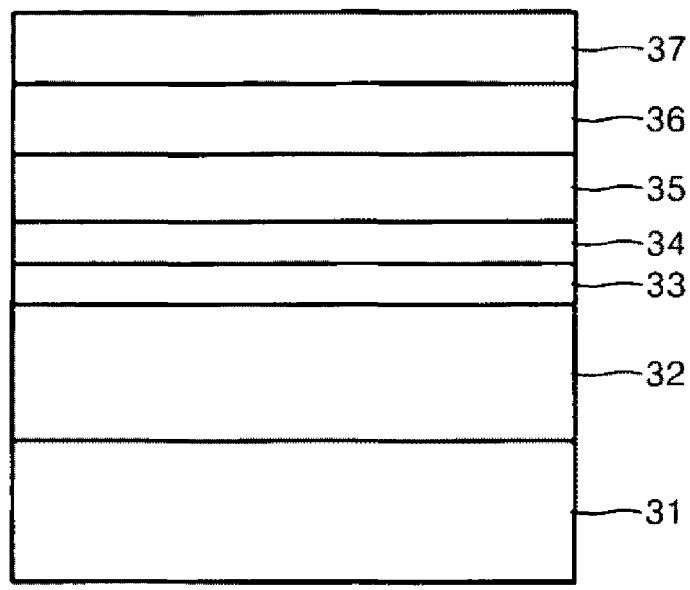
FIG. 3A is a cross-sectional view of a magnetoresistive element including a Cr layer formed below an intermediate layer according to example embodiments.

FIG. 3A is a cross-sectional view of a magnetoresistive element according to example embodiments. Referring to FIG. 3A, the magnetoresistive element may include a pinned layer formed on an anti-ferromagnetic layer 31, wherein the pinned layer may include a first pinned layer 32, an intermediate layer 34, and a second pinned layer 35. A Cr layer 33 may be formed between the first pinned layer 32 and the intermediate layer 34. A tunneling barrier 36 and a free layer 37 may be formed on the second pinned layer 35.

Figure 3B:
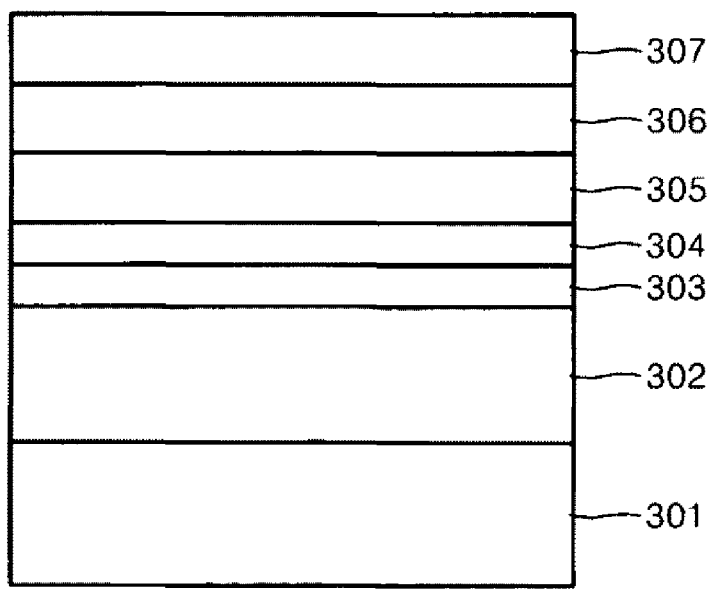
FIG. 3B is a cross-sectional view of a magnetoresistive element including a Cr layer formed on an intermediate layer according to example embodiments.

FIG. 3B is a cross-sectional view of a magnetoresistive element according to example embodiments. Referring to FIG. 3B, the magnetoresistive element may include a pinned layer formed on an anti-ferromagnetic layer 301, wherein the pinned layer may include a first pinned layer 302, an intermediate layer 303, and a second pinned layer 305. The Cr layer 304 may be formed between the intermediate layer 303 and the second pinned layer 305. A tunneling barrier 306 and a free layer 307 may be formed on the second pinned layer 305.

Each of the magnetoresistive elements illustrated in FIGS. 2-3B may be part of a magnetic memory device that includes a switch, for example, a transistor. If the switch is a transistor, the switch may include a gate insulating layer and a gate electrode which may be formed on a substrate having a source and drain. Either of the source or the drain, and one of the anti-ferromagnetic layers 21, 31, and 301, may be electrically connected to form a magnetic memory device.

Examples of materials that may be used to form each of the layers in the magnetoresistive elements, according to example embodiments, will now be described. The anti-ferromagnetic layers 21, 31, and 301 may be formed of an anti-ferromagnetic material including, for example, Mn (e.g., PtMn, IrMn, NiMn, or FeMn). A bottom layer (not shown) below the anti-ferromagnetic layers 21, 31, and 301 may be formed of, for example, a transition metal nitride (e.g. TiN). The first pinned layers 22, 32, and 302, the second pinned layers 26, 35, and 305, and the free layers 28, 37, and 307 may be formed of ferromagnetic materials (e.g., CoFe, CoFeB, or NiFe). The intermediate layers 24, 34, and 303 may be formed of, for example, Ru. The tunneling barriers 27, 36, and 306 may be formed of, for example, an oxide (e.g. Mg oxide, Al oxide, Hf oxide or Ta oxide). A top layer formed on the free layers 28, 37, and 307 (not shown) may be formed of, for example, a metal, including transition metals (e.g. Ta).

A method of manufacturing a magnetoresistive element, according to example embodiments, will now be described. A bottom layer formed of TiN may be formed on a $SiO_2$ substrate. An anti-ferromagnetic layer formed of PtMn having a thickness of about 150 Å may be formed on the bottom layer. An about 25 Å CoFe first pinned layer may be formed on the anti-ferromagnetic layer. An intermediate layer, including a Ru layer and a Cr layer, may be formed on the first pinned layer. An about 30 Å CoFeB second pinned layer may be formed on the intermediate layer. An about 10 Å MgO tunneling barrier may be formed on the second pinned layer. An about 25 Å free layer may be formed on the tunneling barrier. An about 100 Å Ta top layer may be formed on the free layer.

A magnetoresistive element may be formed by, for example, physical vapor deposition (PVD), chemical vapor deposition (CVD), or atomic layer deposition (ALD). Magnetoresistive element samples may be manufactured by using, for example, an Anelva C-7100 sputtering system with an initial chamber vacuum of BOUT $5\times10^{-9}$ Torr. When a metal is deposited, a direct current (DC) voltage may be applied to the manufacturing chamber and when MgO is deposited, a radio-frequency (RF) voltage may be applied to the manufacturing chamber.

Figure 4A:
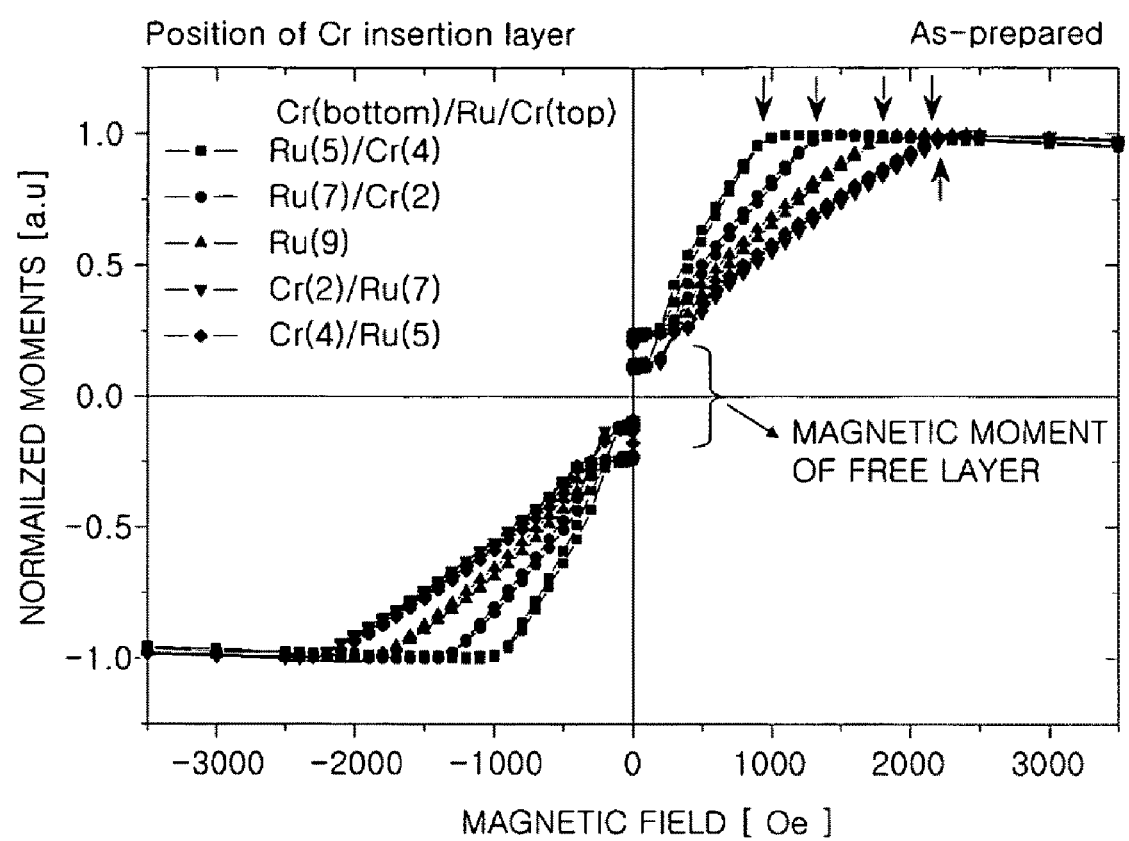
FIG. 4A is a Value Stream Mapping (VSM) graph of normalized magnetic moments versus magnetic field for magnetoresistive element samples, wherein the samples are manufactured according to a specific manufacturing process that does not include a thermal treatment process.

FIG. 4A is a Vibrating Sample Magnetometer (VSM) graph of normalized magnetic moments versus magnetic field for five magnetoresistive element samples composed of different intermediate layers. The different intermediate layers are Ru 5 Å/Cr 4 Å, Ru 7 Å/Cr 2 Å, Ru 9 Å, Cr 2 Å/Ru 7 Å, and Cr 4 Å/Ru 5 Å. The first pinned layer is formed of $Co_{0.75}Fe_{0.25}$ in each sample. The samples are manufactured according to the aforementioned manufacturing process and do not include a thermal treatment process.

Figure 4B:
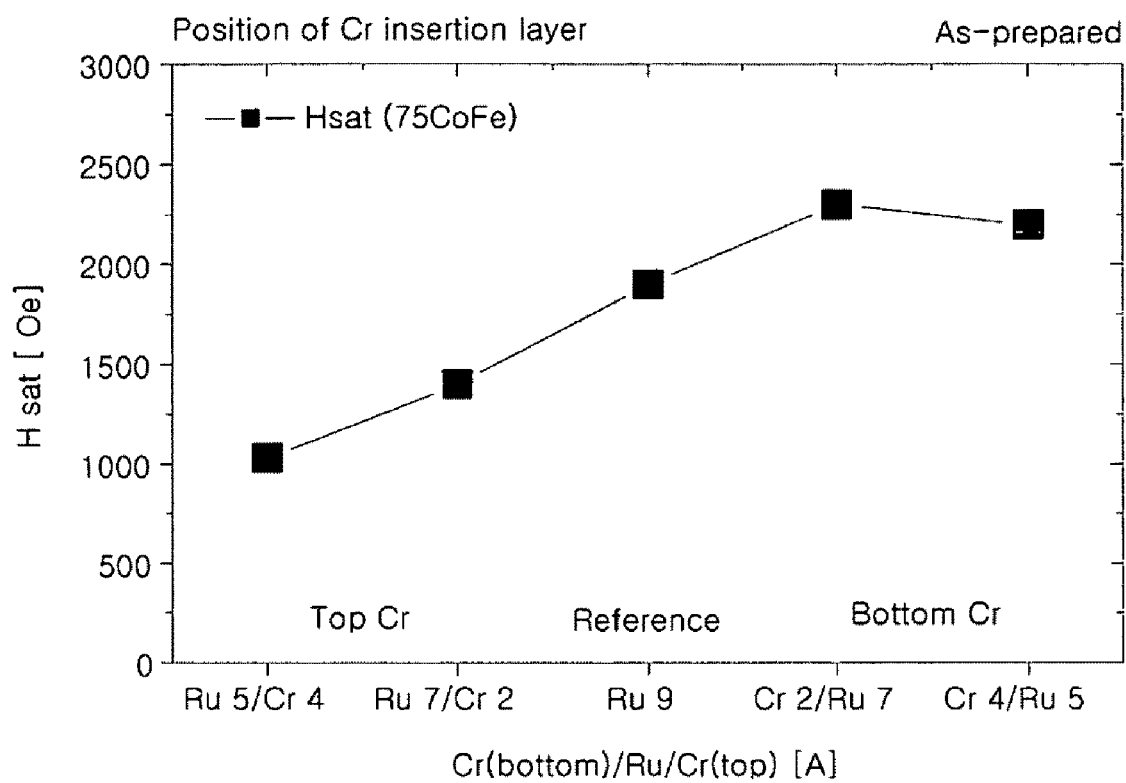
FIG. 4B is a graph demonstrating the saturation magnetization values of the magnetoresistive element samples of FIG. 4A.

FIG. 4B is a graph demonstrating saturation magnetization values of the magnetoresistive element samples of FIG. 4A. Referring to FIG. 4A, when a Cr layer is formed below a Ru intermediate layer, the saturation field (Hsat) value increases. The Cr layer may have a body centered cubic (BCC) structure, forming an interface with a material having a BCC structure (e.g. CoFe), which therefore may exhibit a relatively stable exchange coupling characteristic.

Figure 5:
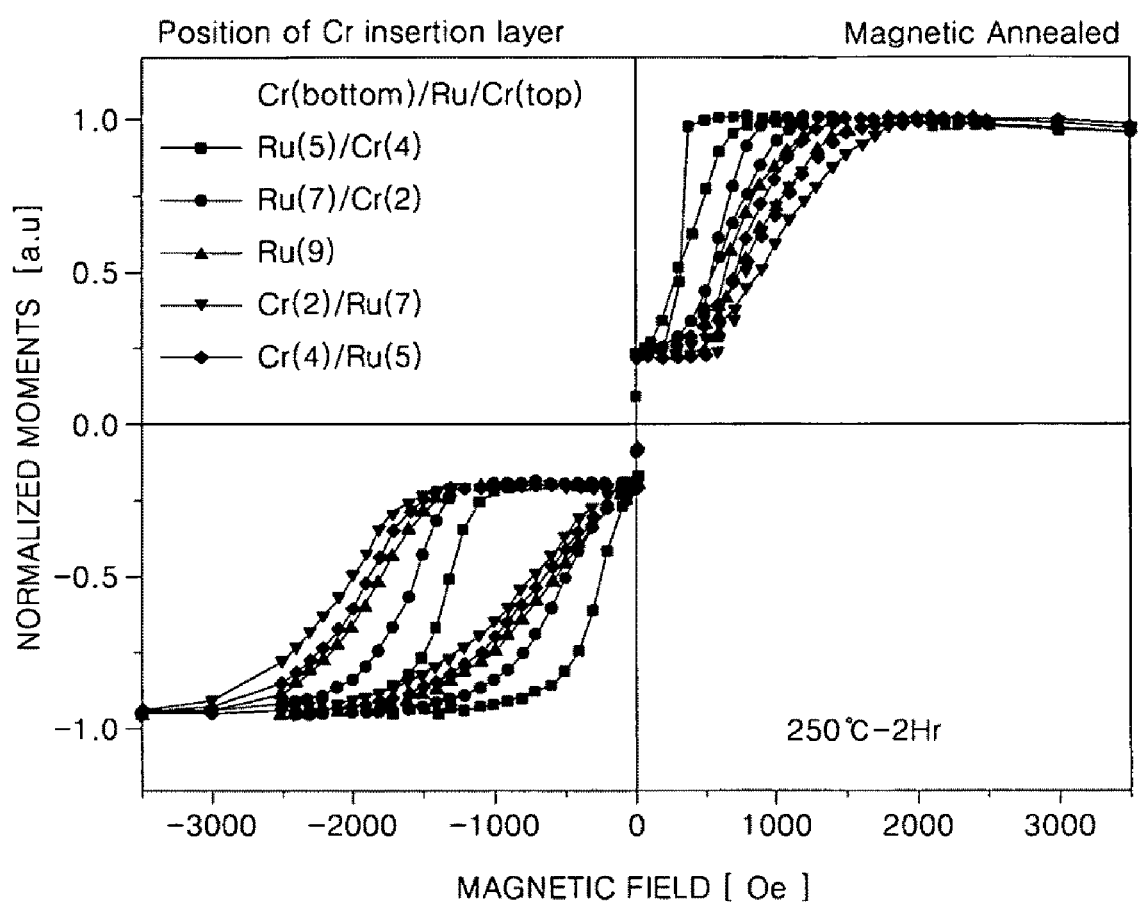

FIG. 5 is a VSM graph of normalized magnetic moments versus magnetic field for five magnetoresistive element samples composed of different intermediate layers, wherein the samples are manufactured according to the aforementioned manufacturing process and include a thermal treatment process performed at about 250° C. for about 2 hours. Referring to FIG. 5, when the thermal treatment process is performed at about 250° C. for about 2 hours, the magnetoresistive element samples exhibit the shown magnetic moment values with respect to magnetic field regardless of where the Cr layer is formed.

Figure 6A:
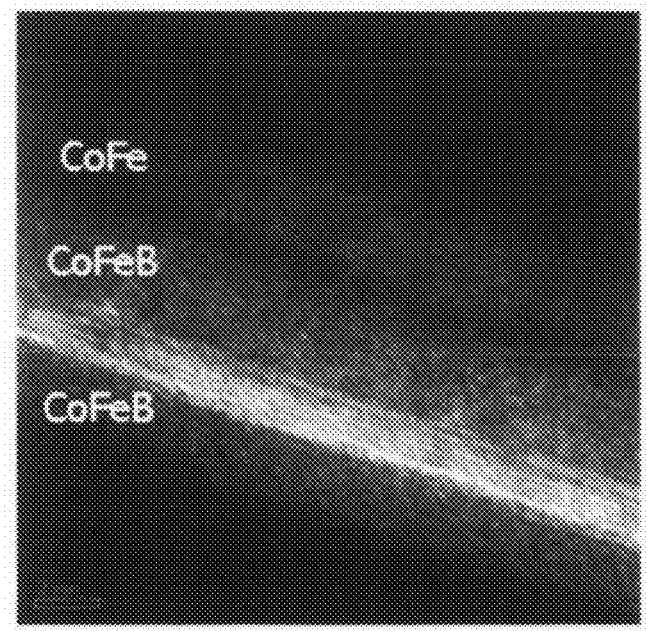
FIGS. 6A and 6B are transmission electron microscopy (TEM) images of a cross-section of a sample in which an about 7 Å thick Ru layer is formed as an intermediate layer and an about 2 Å thick Cr layer is formed on the intermediate layer.
Figure 6B:
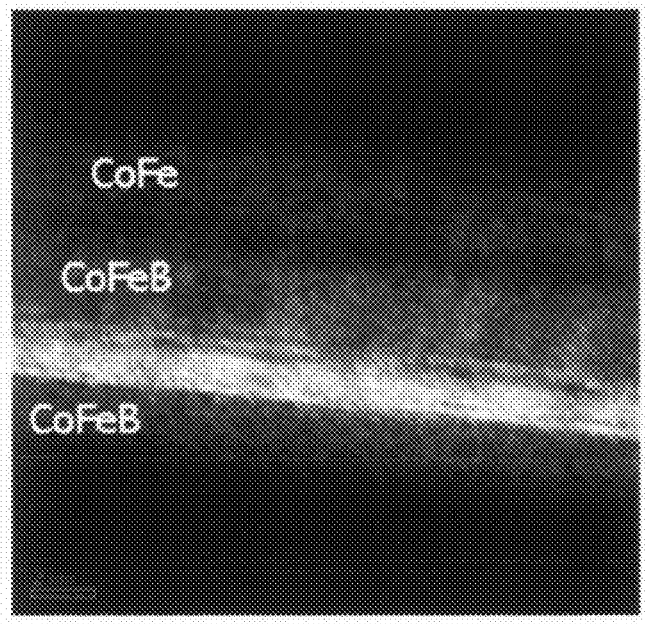
Figure 7A:
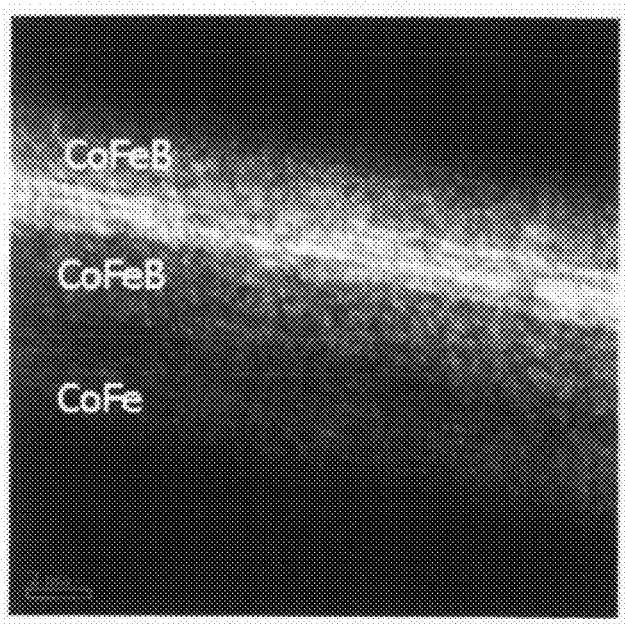
FIGS. 7A and 7B are TEM images of a cross-section of a sample in which an about 7 Å thick Ru layer is formed as an intermediate layer, and an about 2 Å thick Cr layer is formed below the intermediate layer.
Figure 7B:
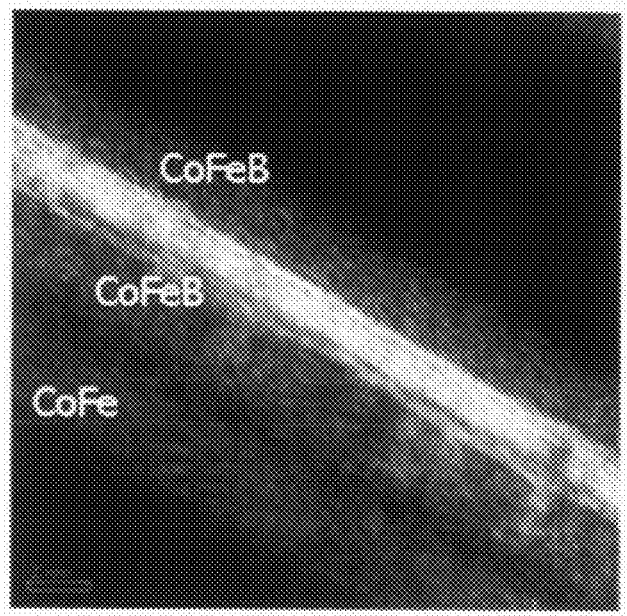

FIGS. 6A and 6B are transmission electron microscopy (TEM) images of a magnetoresistive element cross-section, in which an about 7 Å Ru layer is formed as an intermediate layer, and an about 2 Å Cr layer is formed on the intermediate layer. FIG. 6A is an image of the cross-section before a thermal treatment process is performed, and FIG. 6B is an image of the cross-section after the thermal treatment process is performed. FIGS. 7A and 7B are TEM images of a magnetoresistive element with layers as described above for FIGS. 6A and 6B, except that the Cr layer is formed below the intermediate layer. FIG. 7A and FIG. 7B are images before and after a thermal treatment process is performed, where there are almost no structural changes in either sample.

Figure 8:
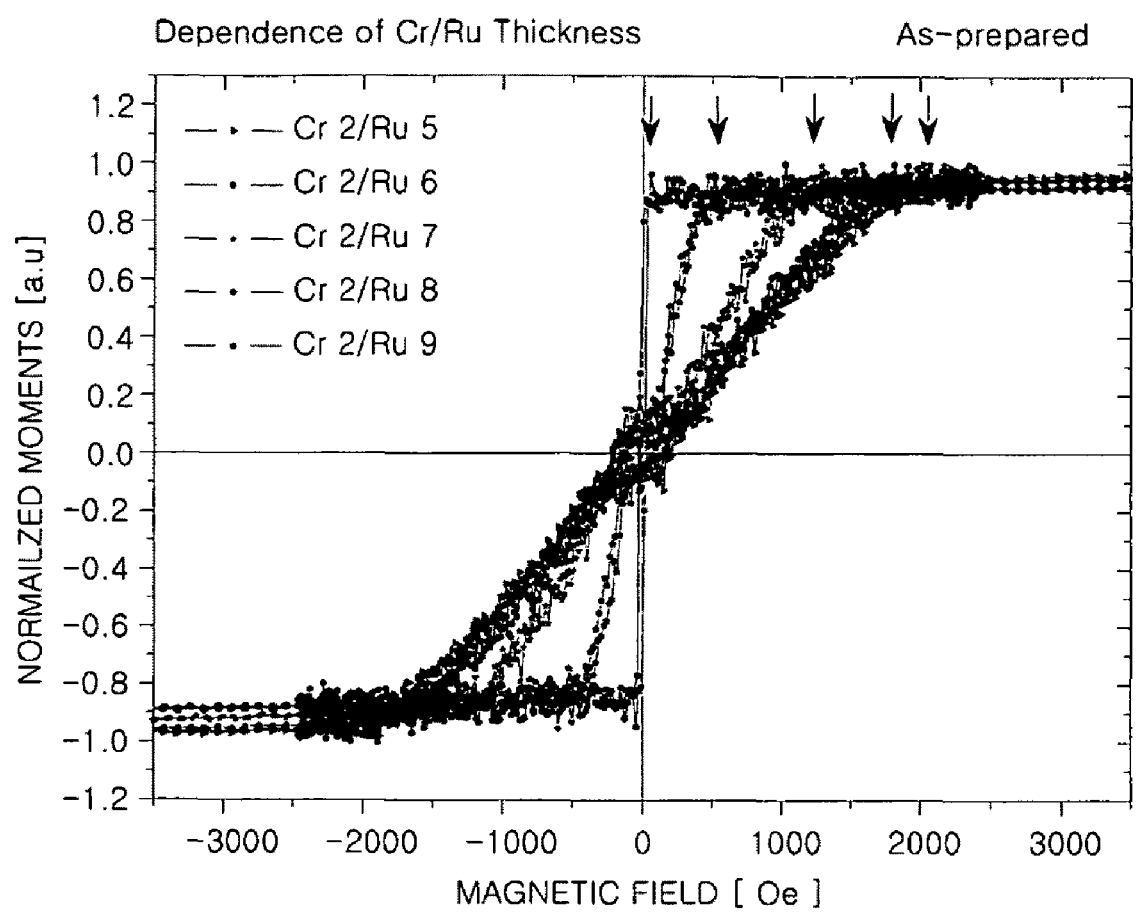

FIG. 8 is a VSM graph of normalized magnetic moments versus magnetic field for five magnetoresistive element samples composed of different intermediate layers. The samples may be manufactured by forming an about 2 Å Cr layer on a first pinned layer and then varying the thickness of Ru layer from about 5 Å to about 9 Å, in about 1 Å increments. The Ru layer may be an intermediate layer. Referring to FIG. 8, the magnetic moment values may vary as a function of the intermediate layer thickness.

Figure 9:
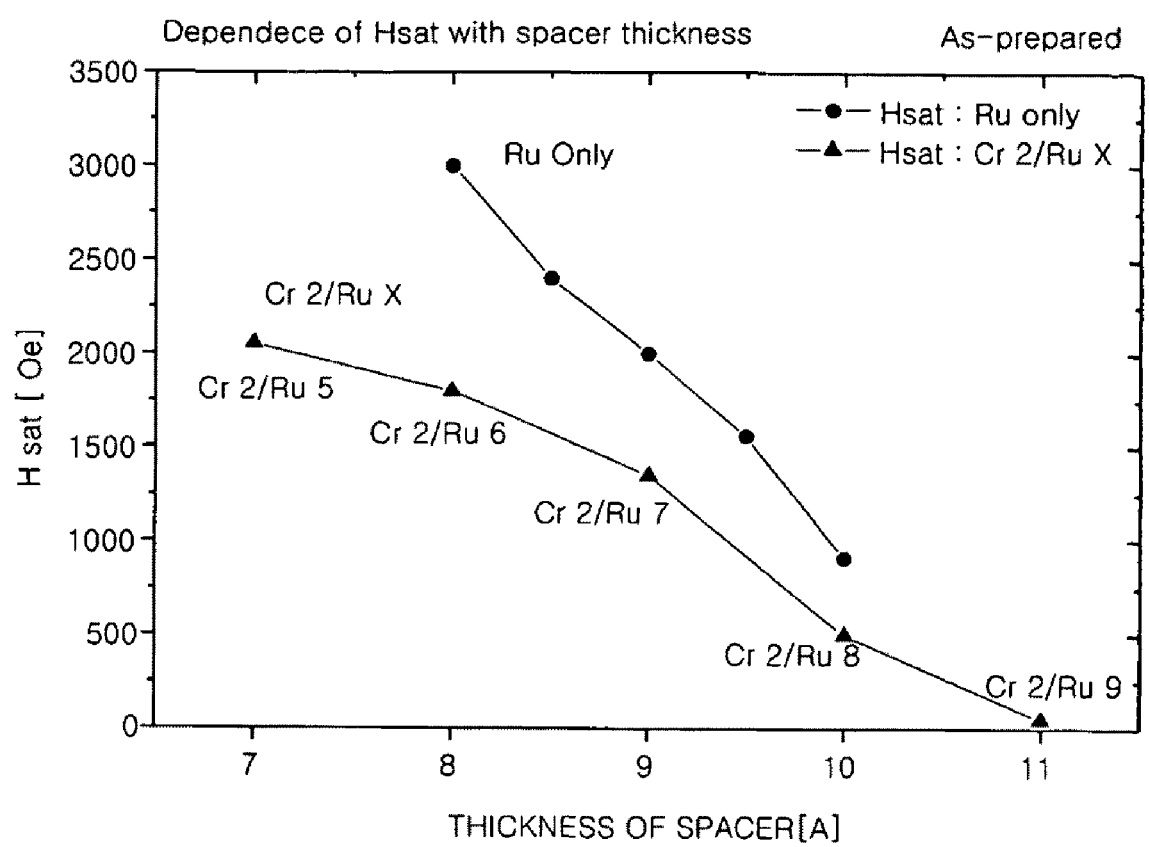

FIG. 9 is a graph demonstrating Hsat values versus spacer thickness for five magnetoresistive element samples composed of different spacer thicknesses. A spacer thickness is the thickness of both the Cr and Ru layers combined. The lower line represents a spacer containing a Ru layer varying in thickness from about 5 Å to about 9 Å, on an about 2 Å Cr layer. The upper line represents a spacer containing only Ru that varies in thickness from about 8 Å to about 10 Å. Ru is an intermediate layer. Referring to FIG. 9, Hsat values decrease as the thickness of the Ru intermediate layer increases.

According to example embodiments, a magnetoresistive element including a Cr layer either on or below an intermediate layer of an SAF structure exhibits stable exchange coupling characteristics.

While example embodiments have been particularly shown and described, it will be understood by one of ordinary skill in the art that variations in form and detail may be made therein without departing from the spirit and scope of the claims. For example, the magnetoresistive element according to example embodiments may include optional layers, for example, a buffer layer, a bottom layer, or a top layer.

What is claimed is:

1. A magnetoresistive element comprising:
    an anti-ferromagnetic layer;
    a pinned layer on the anti-ferromagnetic layer, and having an SAF (synthetic anti-ferromagnetic) structure including a first pinned layer, an intermediate layer, and a second pinned layer; and
    a first chromium (Cr) layer between the intermediate layer and one of the first pinned layer and the second pinned layer.

2. The magnetoresistive element of claim 1, wherein the first Cr layer is between the intermediate layer and the first pinned layer.

3. The magnetoresistive element of claim 1, wherein the first Cr layer is between the intermediate layer and the second pinned layer.

4. The magnetoresistive element of claim 1, further comprising:
    a second Cr layer between the intermediate layer and the second pinned layer,
    wherein the first Cr layer is between the intermediate layer and the first pinned layer.

5. The magnetoresistive element of claim 1, wherein the first pinned layer comprises one selected from the group consisting of CoFe, CoFeB, and NiFe.

6. The magnetoresistive element of claim 1, wherein the second pinned layer comprises one selected from the group consisting of CoFe, CoFeB, and NiFe.

7. The magnetoresistive element of claim 1, wherein the intermediate layer includes Ru.

8. The magnetoresistive element of claim 1, further comprising:
    a tunneling barrier on the second pinned layer; and
    a free layer on the tunneling barrier.

9. The magnetoresistive element of claim 8, wherein the tunneling barrier comprises one selected from the group consisting of Mg Oxide, Al Oxide, Hf Oxide and Ta Oxide.

10. The magnetoresistive element of claim 1, wherein the anti-ferromagnetic layer comprises one selected from the group consisting of PtMn, IrMn, NiMn and FeMn.

11. The magnetoresistive element of claim 1, further comprising:
    a bottom layer on the anti-ferromagnetic layer,
    wherein the bottom layer includes a transition metal nitride.

12. The magnetoresistive element of claim 8, further comprising:
    a top layer on the free layer,
    wherein the top layer includes a transition metal.

13. The magnetoresistive element of claim 8, wherein the free layer comprises one selected from the group consisting of CoFe, CoFeB, and NiFe.

14. The magnetoresistive element of claim 1, wherein the first Cr layer has a body centered cubic (BCC) structure.

15. The magnetoresistive element of claim 4, wherein the first Cr layer and the second Cr layer have a body centered cubic (BCC) structure.

16. The magnetoresistive element of claim 1, further comprising:
    a switch connected to the anti-ferromagnetic layer.

17. The magnetoresistive element of claim 16, wherein the switch includes a source and a drain, and the anti-ferromagnetic layer is connected to either the source or the drain.

18. The magnetoresistive element of claim 1, wherein the thickness of the first Cr layer is between about 1 Å and about 4 Å.

19. The magnetoresistive element of claim 4, wherein the thickness of the second Cr layer is between about 1 Å and about 4 Å.

20. The magnetoresistive element of claim 1, wherein the thickness of the first Cr layer and the intermediate layer combined is between about 7 Å and about 11 Å.

* * * * *